United States Patent [19]
Brown

[11] 4,398,340
[45] Aug. 16, 1983

[54] METHOD FOR MAKING THIN FILM FIELD EFFECT TRANSISTORS

[75] Inventor: Robert L. Brown, Huntsville, Ala.

[73] Assignee: The United States of America as represented by the Secretary of the Army, Washington, D.C.

[21] Appl. No.: 371,639

[22] Filed: Apr. 26, 1982

[51] Int. Cl.³ .......................................... H01L 21/363
[52] U.S. Cl. ...................................... 29/571; 29/578; 29/580
[58] Field of Search .......................... 29/571, 578, 580

[56] References Cited
U.S. PATENT DOCUMENTS 3,258,663 6/1966 Wiemer ............................. 29/578 X
3,470,610 10/1969 Breitweiser ........................... 29/571
3,520,051 7/1970 Topfer et al. ......................... 29/571
3,616,527 11/1971 Janning ............................... 29/571
4,252,580 2/1981 Messick ........................... 148/171 X
4,331,758 5/1982 Luo ................................. 29/571 X
4,372,032 2/1983 Collins et al. ......................... 29/571

Primary Examiner—G. Ozaki
Attorney, Agent, or Firm—Robert P. Gibson; Anthony T. Lane; James T. Deaton

[57] ABSTRACT

A method for making thin film field effect transistors that utilize a semiconductor material that is altered by acid etching and providing steps for producing the transistors such that the semiconductor material is protected from the acid solutions and therefore preventing the semiconductor material from being altered in the process of making the transistors.

3 Claims, 2 Drawing Figures

METHOD FOR MAKING THIN FILM FIELD EFFECT TRANSISTORS

DEDICATORY CLAUSE

The invention described herein may be manufactured, used, and licensed by or for the Government for governmental purposes without the payment to me of any royalties thereon.

BACKGROUND OF THE INVENTION

In the past, procedures for producing field effect transistors have utilized semiconductor material such as silicon or germanium that is not effected by photolithographic etching techniques. These same procedural steps for making silicon or germanium semiconductor transistor devices were attempted on thin film field effect transistors utilizing polycrystalline cadmium selenide, polycrystalline cadmium sulfide or other semiconducting compounds or mixtures that are effected by acid etching. Due to the semiconductor material being effected by acid etching, transistors with these materials could not be produced to acceptable standards. More specifically in relation to the prior art, the field effect transistor as manufactured utilizing prior art uses an extremely simple, low cost process by which all of the working elements of the transistors are deposited by conventional vacuum deposition methods, by depositing the various materials of the several layers required in the position, sequence and patterns required to form the finished transistor. These working elements are deposited, one layer at a time on a flat insulating substrate at a series of working stations. The patterns deposited are defined by a series of aperture masks. These masks are thin, flat metal sheets, in function similar to stencils, having the required pattern as aperture etched through the stencil or mask. At each work station, the selected mask is placed in its correct position against the substrate, after which the required material is deposited on the substrate in the correct thickness required and the pattern as determined by the aperture pattern in the mask. The number of stations and their sequence are organized to produce working arrays of thin film field effect transistors by the described deposition of the various elemental patterns comprising the working thin film field effect transistor and its associated patterns during a single trip through the vacuum chamber. This simple, easily accomplished method for manufacturing thin film transistors has led prior investigators to concentrate their efforts on improving the process, without, as must be concluded from the available evidence, being aware of the limitations thereof. These limitations are imposed by the etched patterns in the aperture masks used to define the various elements of the transistors. For mechanical reasons the shadow masks are made of sheet metal one mil in thickness, with etched patterns. This manufacturing process is limited in practice to producing masks with apertures no smaller than approximately two mils in the narrowest dimension.

The result is that this opening width determines the narrowest width of transistor element that can be deposited through the openings of such masks. Moreover, the mask manufacturing process leaves irregular edges on the mask apertures, as a result of varying rates of etch attack on the randomly oriented crystallities of the mask metal microstructure. These factors combine to limit the performance of prior art thin film transistors made by successive deposits as defined by such masks.

It is well known to those skilled in the art that there are several critical dimensions that control the performance of thin film field effect transistors. It is obvious that the current rating of the transistor is dependent upon the cross sectional area of the semiconductor. That is, the thickness of semiconductor, which is readily deposited to the precision required, times the width of the semiconductor deposit, which is difficult to define by the imperfect mask. Even more critical dimensional requirements are found in other parts of the transistor, to the extent that many narrow structures, such as gate dimensions in the desirable three to five micron source-to-drain length cannot be produced by the aperture masks used in manufacture of thin film field effect transistors.

In conventional silicon based microelectronics, such dimensional accuracy is obtained by etching the transistor, by which the patterns in the required dimensional accuracy and small sizes are readily produced by photolithographic techniques. These techniques are universal in the manufacture of silicon and germanium devices, and are so well understood as to be common knowledge among those familiar with the art. As mentioned before, state-of-the-art in manufacturing thin film field effect transistors in their manufacture by vacuum deposition of their various elements in their finished configuration by the use of a sequence of aperture masks without lithographic techniques being applied. The few attempts to use photolithographic definition of etch pattern have failed in that prior efforts have attempted to use photolithography on unprotected (uncoated) semiconductor layers, and contact the unprotected surface of the semiconductor film with reactive chemicals at some stage of the photolithographic process. This contact on the very thin layer of semiconductor material has invariably destroyed transistor action, either by dissolving or contaminating the semiconductor. The net effect is that "Prior Art" has established the belief that the photolithographic techniques, so universal in manufacturing semiconductor devices from silicon or germanium, cannot be effectively utilized in the manufacture of thin film field effect transistors. Therefore, it can be clearly realized that there is a need for a method by which thin film field effect transistors can be produced accurately and with small percentage variation in properties utilizing photolithographic techniques.

Therefore, it is an object of this invention to provide a method by which the photolithographic technology from semiconductor manufacture can be successfully applied to make thin film field effect transistors according to this invention.

Another object of this invention is to provide a method for construction of thin film field effect transistors with configurations suited to utilization of photolithographic processing as a means of obtaining very accurately defined small dimensions that are required for transistors of superior characteristics.

A further object of this invention is to provide a method by which photolithographic processes can be used and in which the semiconductor material is protected from coming in contact with acid etching in the photolithographic process.

Still another object of this invention is to provide a simple method for making thin film field effect transistors by utilizing known techniques for each of the individual steps.

Other objects and advantages of this invention will be obvious to those skilled in this art.

SUMMARY OF THE INVENTION

In accordance with this invention, a method for making thin film field effect transistors includes first providing a substrate with a planar face and providing a thin film of metal on said planar face, photolithographically and acid etching the metal film to provide an input connection and an output connection for the transistor with a gap therebetween, depositing a layer of semiconductor material over a portion of said input and output connections, depositing an insulative layer completely over said semiconductor layer, depositing a metal layer over a portion of said insulative layer and finally photolithographically and acid etching of said gate metal layer to remove the metal that is not over and needed for the gate. If desired, contact metal can also be deposited over a portion of the input connection, the output connection and the lead end of the gate to form connections for circuit elements external to the transistor.

DESCRIPTION OF THE PREFERRED EMBODIMENT

Figure 1:
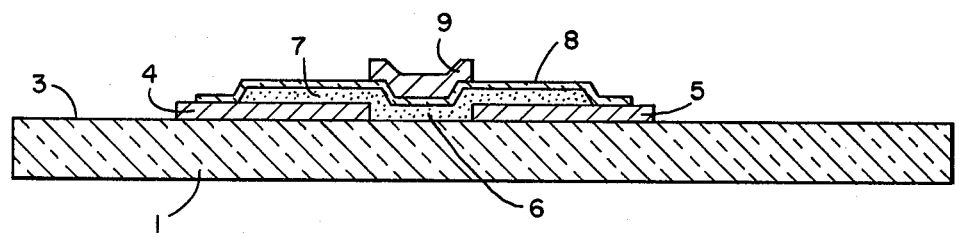
FIG. 1 is a sectional view illustrating the substrate and layers of the transistor as produced in accordance with this invention.
Figure 2:
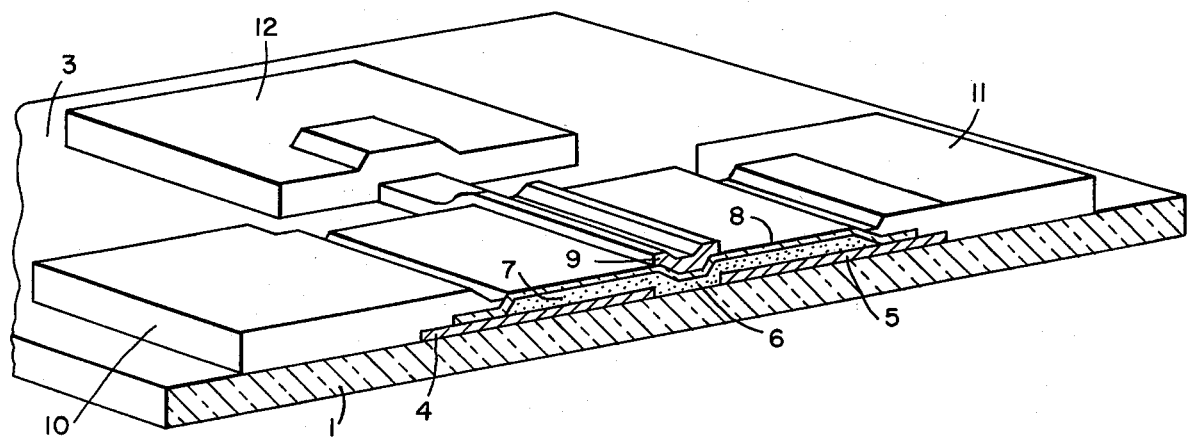
FIG. 2 is a plan view partially in section illustrating the transistor layers as well as the metal contacts.

Referring now to FIG. 1, the method of making the thin film field effect transistors in accordance with this invention is carried out by providing a suitable substrate 1 such as of glass with a substantially flat planar surface 3, placing or depositing a thin metal sheet on the planar surface and then photolithographically and acid etching first and second connections 4 and 5 to define a precision gap 6 between connections 4 and 5, and next depositing on clean surfaces of connections 4 and 5 a predetermined layer of a semiconductor material 7 to a predetermined thickness such as by vapor or vacuum deposition to fill gap 6. Semiconductor material 7 is deposited in a pattern to completely fill gap 6 and overlap connections 4 and 5 at least slightly to insure that gap 6 is completely bridged with semiconductor material. Semiconductor material 7 is preferably polycrystalline cadmium selenide, polycrystilline cadmium sulfide or other semiconducting compounds or mixtures of compounds that have properties that are attacked by acid etching. Other semiconductor materials not attacked by acid etching could be used. Semiconductor material 7 can be deposited through a mask when depositing the material over connections 4 and 5 and for filling gap 6. Next, an insulation layer of a material such as glass or aluminum oxide is deposited to a predetermined depth and in a pattern which is slightly larger than semiconductor 7 so as to overlap semiconductor layer 7 slightly on all sides. By making insulating layer 8 slightly larger than semiconductor material 7, causes the semiconductor material to be protected from the next step that involves acid etching. Insulating layer 8, to perform its desired function, must be of an impervious, inert insulator material to protect semiconductor material 7 and also perform its insulating function. If desired, insulating layer 8 can also be deposited through a mask to define the overall shape of the insulative layer. Next, a layer of metal 9 is deposited such as through a mask of suitable size and is deposited to a suitable thickness and of a width sufficient for overlapping gap 6 on all sides. The oversize deposit of gate metal 9 is then photolithographically and acid etched to final and precision size to completely cover gap 6 between connections 4 and 5 with as little overlap as possible over either connection 4 and/or connection 5. All photolithographic and acid etching steps utilize materials, equipment and procedures that are familiar to those of the microelectronics industry. This last step of photolithographic and acid etching of gate metal 9 to substantially the exact shape of gap 6 reduces the parasitic capacitance of the transistor to a minimum since any gate metal overlay on either connection 4 or connection 5 adds parasitic capacitance which reduces both transistor high-frequency response and gain. Also, transistor gain is improved by confining gate metal 9 to just cover channel 6 and maximize transistor gain by maximizing the percent of the gate electric field extending into the semiconductor within gap or channel 6. The photolithographic acid etching steps do not damage the semiconductor material since it is protected by the impervious insulation barrier or by the photolithographic and acid etching and cleaning steps being carried out before depositing the semiconductor material on the clean contacts. Contacts 4, 5 and metal gate 9 are made of conventional metals for transistors and may be from cooper. If desired each of connections 4, 5 and gate 9 can be provided with a source contact as illustrated in FIG. 2 by depositing a layer of metal over a portion of connection 4, connection 5 and gate 9 as illustrated in FIG. 2 at 10, 11 and 12. These metal contacts 10, 11 and 12 form connections that are adaptable for connection to circuit elements external to the transistor.

The gains realized by using the method of this invention to produce transistors is an order higher than those previously reported by prior art transistor devices. The transistors produced by this method result in transistors which operate at far higher frequencies than those of the prior art. Specific gains of about 200 is the highest that applicant is aware of in the prior art and a gain of over 1000 is easily obtainable with the method and materials of this invention. Accordingly, it can be clearly seen that this specific method enables the state of the art to be considerably advanced in enabling one to produce more precision devices than by other prior methods. As can be seen, one of the main advantages of this invention enables one to use photolithographic etching steps in such a way that the semiconductor material is not damaged or altered due to its being protected from the photolithographic etching steps. It is also important to point out that devices of this nature can be readily reproduced with under 10 percent variation in properties of one transistor to another.

I claim:

1. A method for making thin film field effect transistors comprising providing a substrate that has a substantially flat surface thereon, mounting a thin metal film on said surface of said substrate, photolithographic and acid etching first and second connections from said thin metal film to define a predetermined gap between said first and second connections, depositing a layer of semiconductor material in said gap and overlapping portions of said first and second connections, depositing an impervious insulation layer that overlaps all sides of said semiconductor layer over said semiconductor and a portion of said first and second connections, depositing a metal layer as a gate over said insulation layer and photolithographic and acid etching said metal gate to a size that is substantially identical in width to the gap between said first and second connections to provide a thin film field effect transistor that has high frequency characteristics due to the materials of the transistor and the precision by which the transistor can be made.

2. The method of making a thin film field effect transistor as set forth in claim 1, wherein said semiconductor material is selected from polycrystalline cadmium selenide and polycrystalline cadmium sulfide and wherein said semiconductor material is protected from acid etching of said first and second connections by being deposited after said first and second connections are acid etched and being protected by said impervious insulation layer from acid etching of said gate metal layer.

3. A method of making a thin film field effect transistor as set forth in claim 1, wherein said first and second connections and said gate have metal contacts deposited over a portion thereof to form connections adapting the first and second connections and the gate for ready connection to elements external to the transistor.

* * * * *

UNITED STATES PATENT AND TRADEMARK OFFICE
CERTIFICATE OF CORRECTION

PATENT NO. : 4,398,340

DATED : August 16, 1983

INVENTOR(S) : Robert L. Brown

It is certified that error appears in the above—identified patent and that said Letters Patent is hereby corrected as shown below:

In the "Assignee", delete "The United States of America as represented by the Secretary of the Army, Washington, D.C."

Signed and Sealed this

Twelfth Day of June 1984

[SEAL]

Attest:

Attesting Officer

GERALD J. MOSSINGHOFF

Commissioner of Patents and Trademarks